United States Patent [19]
Williams et al.

[11] Patent Number: 5,508,874
[45] Date of Patent: Apr. 16, 1996

[54] DISCONNECT SWITCH CIRCUIT TO POWER HEAD RETRACT IN HARD DISK DRIVE MEMORIES

[75] Inventors: Richard K. Williams, Cupertino; Allen A. Chang, Milpitas; Barry J. Concklin, San Jose, all of Calif.

[73] Assignee: Siliconix Incorporated, Santa Clara, Calif.

[21] Appl. No.: 62,503

[22] Filed: May 14, 1993

[51] Int. Cl.[6] ................................. H02H 3/24
[52] U.S. Cl. ................... 361/92; 361/33; 361/58
[58] Field of Search ................... 361/92, 58, 33

[56] References Cited

U.S. PATENT DOCUMENTS

| | | | |
|---|---|---|---|
| 4,237,501 | 12/1980 | Barmache et al. | 360/75 |
| 4,271,438 | 6/1981 | Cornell | 360/32 |
| 4,409,527 | 10/1983 | Sommeria | 318/341 |
| 4,679,102 | 7/1987 | Wevers et al. | 360/75 |
| 4,710,686 | 12/1987 | Guzik | 363/98 |
| 4,760,324 | 7/1988 | Underhill | 323/282 |
| 4,812,961 | 3/1989 | Essaff et al. | 363/61 |
| 4,829,415 | 5/1989 | Haferl | 363/56 |
| 4,901,216 | 2/1990 | Small | 363/98 |
| 4,926,354 | 5/1990 | Pattantyus | 363/98 |
| 4,945,467 | 7/1990 | Bhagwat | 363/132 |
| 4,999,728 | 3/1991 | Curl | 361/33 |
| 5,010,293 | 4/1991 | Ellersick | 361/58 |
| 5,019,719 | 5/1991 | King | 307/577 |
| 5,073,837 | 12/1991 | Baek | 361/92 |
| 5,119,000 | 6/1992 | Schultz | 318/254 |
| 5,157,592 | 10/1992 | Walters | 363/17 |
| 5,262,704 | 11/1993 | Farr | 318/434 |
| 5,303,101 | 4/1994 | Hatch et al. | 360/105 |
| 5,325,030 | 6/1994 | Yamamura et al. | 318/563 |

*Primary Examiner*—Todd DeBoer
*Attorney, Agent, or Firm*—Skjerven, Morrill, MacPherson, Franklin & Friel; David E. Steuber

[57] ABSTRACT

A disconnect switch circuit for disconnecting an under-voltage battery from a hard disk drive connected between a voltage supply line and ground includes a MOSFET device connected between the battery and the voltage supply line, control means responsive to the supply voltage on the voltage supply line for generating a control signal powering the gate of the MOSFET switch. The control signal turns on the MOSFET switch when the supply voltage is in normal condition and turns off the MOSFET switch when the supply voltage drops below an under-voltage limit, thereby beginning head retract in the hard disk drive.

23 Claims, 8 Drawing Sheets

DISCONNECT SWITCH CIRCUIT TO POWER HEAD RETRACT IN HARD DISK DRIVE MEMORIES

BACKGROUND OF THE INVENTION

The present invention relates to a disconnect switch circuit, and more particularly to a disconnect switch circuit to power the head retract in a hard disk drive memory.

1. Related Applications

This application is related to the following applications, each of which is being filed on the same day, and each of which is incorporated herein by reference: U.S. application Ser. No. 08,062,503 U.S. application Ser. No. 08,062,968 U.S. application Ser. No. 08,062,969.

2. Description of Prior Art

Moving-media hard disk drive (HDD) memories are commonly used in battery powered portable computers whenever substantial amounts of memory storage are required. In moving-media hard disk drive memories, the motion of a spinning disk suspends a magnetic read/write head above the media to facilitate motion of the head across the disk. A voice coil driver or head actuator is then used to position the head above a particular data sector and track. When the battery fails or is unexpectedly disconnected, emergency power-down procedures including retracting the read/write head to areas free from encoded data must be performed. The positioning of the head into a safe area is known as a "head retract".

If the head retract is not completed before the head crashes onto the disk, permanent loss of data and damage to the disk may result. In order to prevent such a damaging head crash, the head retract circuit and power devices must be powered from an auxiliary power supply. Typically, this auxiliary power supply for performing head retract is created by isolating the flyback electromotive force (emf) generated by the spindle motor in a HDD.

FIG. 1 shows an example of a prior art circuit for preventing crash of the read/write head onto the disk. A Schottky diode 102 is placed in series between a battery 101 and a HDD which includes a spindle circuit 104 and a head actuator circuit 103. Spindle circuit 104, which drives a three-phase spindle motor 130, includes an output stage 120 having three phase-bridges 121, 122, 123, and a spindle control 105. Head actuator circuit 103 includes a head actuator control 141 to control positioning of the head, a head retract circuit 142 to perform the head retract, and an output stage 143 to drive a voice coil motor 144. Under normal operation, battery voltage $Vba_{bat}$ is applied to the anode of the isolating Schottky diode 102, which is forward-biased and provides a supply voltage Vcc on a voltage supply lead 160. Spindle control 105 converts the D.C. voltage Vcc into a three-phase supply for spindle motor 130. If an unexpected power failure occurs while spindle motor 130 is rotating, Vbat drops to ground and spindle motor 130 becomes a generator due to the momentum of the rotor, generating alternating emf voltage which supply an auxiliary voltage to voltage supply line 160 through the intrinsic antiparallel diodes 131, 133 and 135, acting together as a three-phase rectifier. The auxiliary voltage supply causes Schottky diode 102 to be reverse-biased so as to prevent the residual emf from being drawn by other circuits of the portable computer, thereby isolating the spindle motor 130 from any other circuitry connected to battery 101. As the rotor of motor 130 slows down the emf voltage, and hence the Vcc provided by the auxiliary supply, decrease in amplitude. However, during the time between battery failure and the fall of Vcc, the Vcc created by the emf voltage can be used to perform the head retract and/or other emergency power-down procedures.

A disadvantage of this arrangement is that Schottky diode 102 consumes significant amounts of power under normal operation. It is commonly understood that the forward voltage drop across a Schottky diode is approximately 0.5 volts or higher. It is also known that a typical spindle motor for a hard disk drive draws a current of several amps. Therefore, at least a watt of power is lost due to the Schottky diode 102. In addition, the presence of Schottky diode 102 in the battery path limits the emf of motor 130 to a value below Vbat −0.5V. The back emf voltage in a motor can never exceed the voltage powering it. Therefore a reduction in voltage due to the Schottky drop must reduce the emf voltage on the motor by the same amount. For hard disk drive powered by 5 or even 3 volts, this 0.5 volt drop is detrimental to efficiency and reliable operation. The lower range of Vcc provided by the flyback emf may in some cases prevent an adequate amount of time at useful voltage to facilitate a successful head retract.

SUMMARY OF THE INVENTION

Accordingly, one object of the present invention is to perform head retract more efficiently and reliably in the event of a power failure.

Another object of the present invention is to increase the voltage provided by the flyback emf of the spindle motor which is available to perform the head retract.

Another object of the present invention is to eliminate the Schottky diode in a disconnect switch circuit to power head retract in hard disk drive memories.

In accordance with the present invention, a disconnect switch circuit for disconnecting a power source from a voltage supply line includes a MOSFET switch connected between the power source and the voltage supply line, and control means responsive to the supply voltage on the voltage supply line for generating a control signal provided to the gate terminal of the MOSFET switch, the control signal turning on the MOSFET switch when the supply voltage is above a predetermined reference value and turning off the MOSFET switch when the supply voltage drops below the predetermined reference value.

In accordance with one aspect of the present invention, the gate of the MOSFET switch is powered by a direct connection to a charge pump operated only when the supply voltage is above the predetermined reference value.

In accordance with another aspect of the present invention, the gate of the MOSFET switch is powered by a charge pump through a pass transistor which conducts only when the supply voltage is above the predetermined reference value.

In accordance with another aspect of the present invention, the gate of the MOSFET switch is powered by an auxiliary voltage source recovered from the inductive flyback spike of the spindle motor through a pass transistor which conducts only when the supply voltage is above the predetermined reference value.

In accordance with another aspect of the present invention, the MOSFET switch is a P-channel MOSFET device, and a transistor is connected between the gate of the P-channel MOSFET switch and ground, the transistor shunting the gate to ground when the supply voltage is above the predetermined reference value.

In accordance with the present invention, the disconnect switch circuit may include a comparator and an under-voltage reference generator to generate a signal indicative of normal or abnormal battery condition.

The above and other objects, features, and advantages of this invention will be apparent from the following detailed description of the invention in conjunction with the drawings.

DETAILED DESCRIPTION OF THE INVENTION

Figure 1:
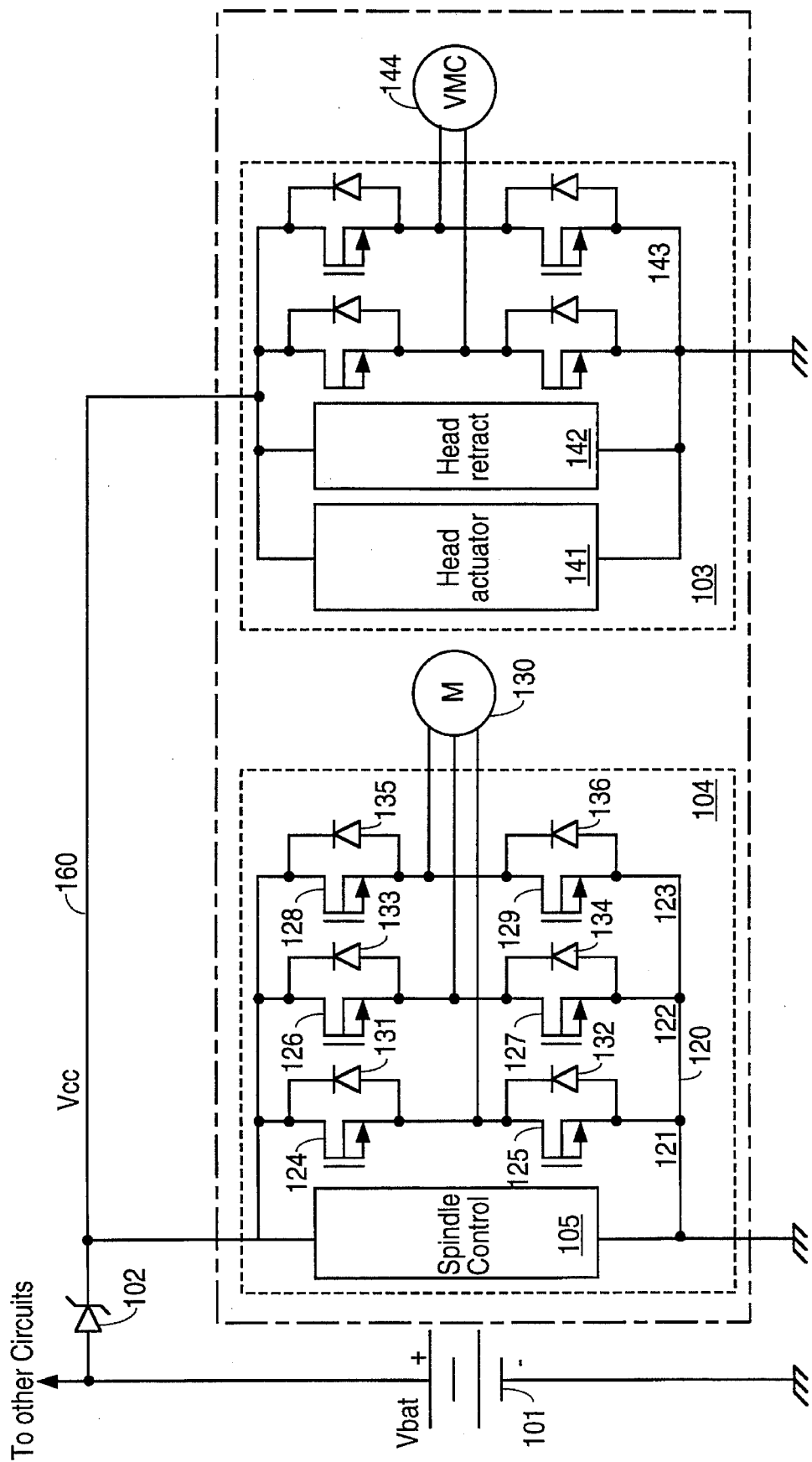
FIG. 1 shows a schematic diagram of a prior art circuit for preventing crash of the read/write head onto the disk.
Figure 2A:
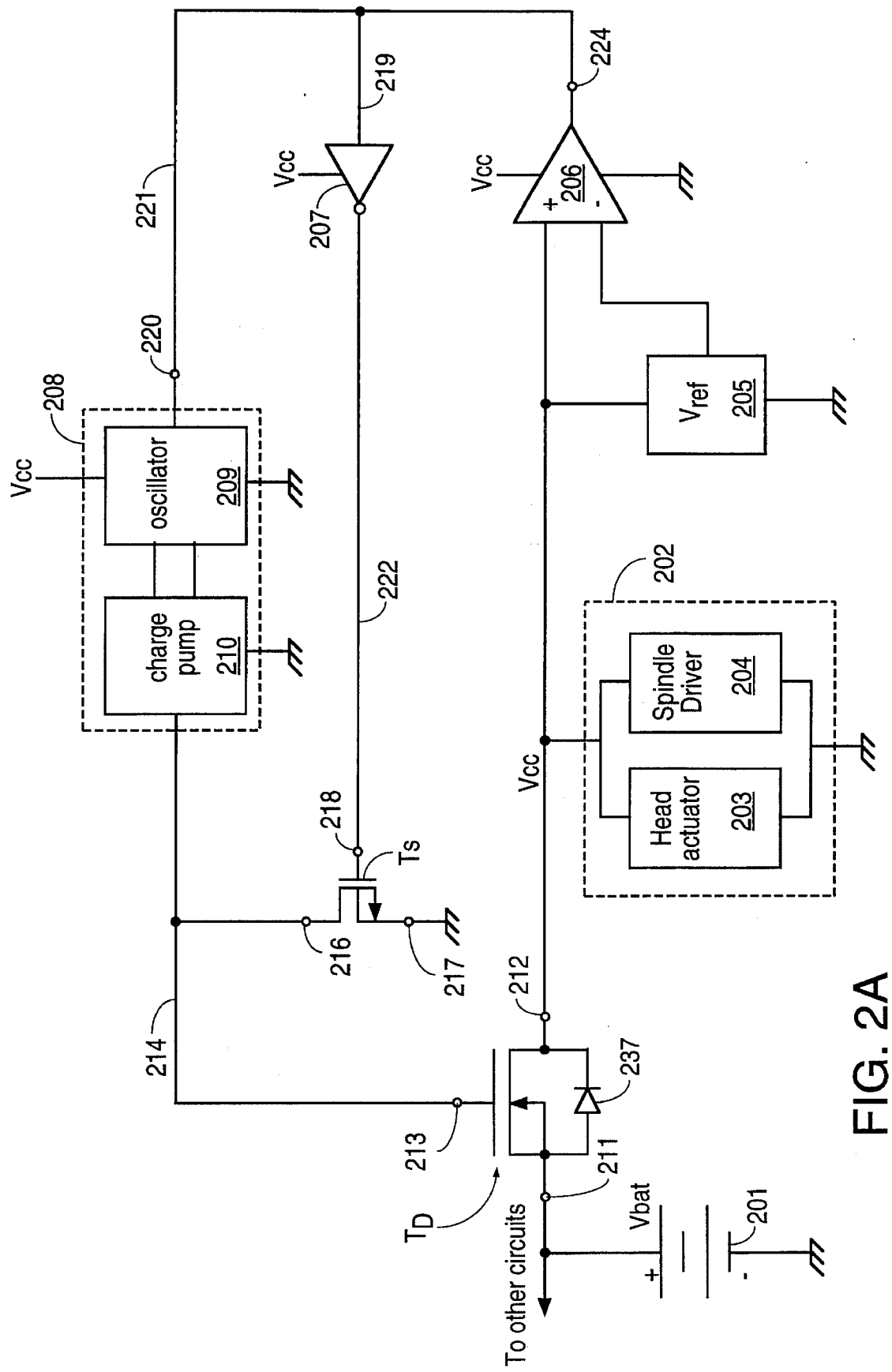
FIG. 2A shows a schematic diagram of a circuit in accordance with the first embodiment of the present invention.

Reference is now made to FIG. 2A, which shows a disconnect switch circuit to disconnect a battery and to power head retract in a hard disk drive in the event of battery failure. As shown in FIG. 2A, the first embodiment of the present invention includes an N-channel MOSFET $T_D$ whose source is connected to the positive terminal of a battery 201 and whose drain is connected to a HDD 202 which comprises a head actuator 203 and spindle driver 204 which are similar to those in FIG. 1. Battery 201 provides a supply voltage Vcc through MOSFET $T_D$ to HDD. Vcc also powers an under-voltage reference generator 205, a comparator 206, an inverter 207 and an oscillator/charge pump 208. The output of oscillator/charge pump 208 powers the gate 213 of MOSFET $T_D$ through a lead 214 and is also connected to a drain 216 of a shunt transistor $T_s$. A source/body terminal 217 of transistor $T_s$ is grounded. The output signal of comparator 206 is provided as an input to inverter 207 through a lead 219 and to an enable terminal 220 of oscillator 209 through a lead 221. The output signal of inverter 207 is provided to a gate 218 of grounded shunt transistor $T_s$ through a lead 222.

Figure 2B:
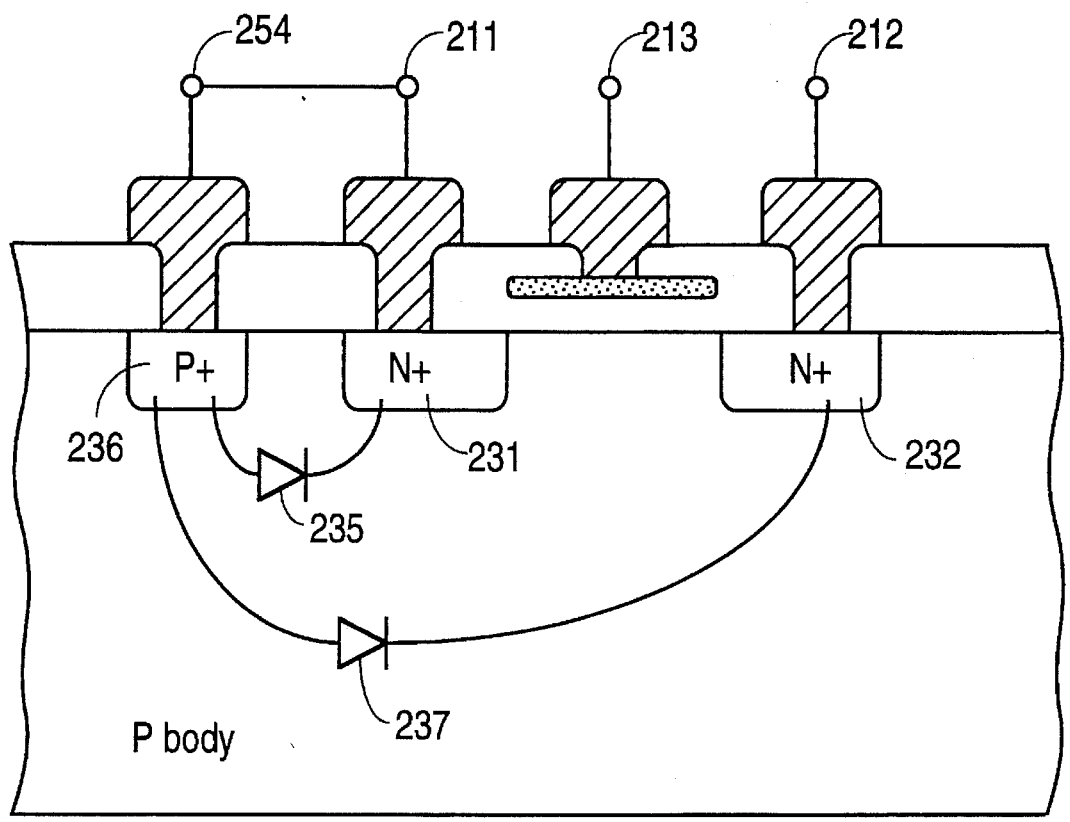
FIG. 2B shows a partial cross sectional view of a N-channel MOSFET device.

FIG. 2B shows a cross section of the N-channel MOSFET $T_D$ of FIG. 2A. MOSFET $T_D$ includes an N-type source region 231, an N-type drain region 232, a gate terminal 213 and a P-type body containing a body contact region 236. A body terminal 254 is electrically connected to a source terminal 211 as shown in FIG. 2B, thereby causing an intrinsic diode 235 between the source 231 and the body and causing an intrinsic diode 237 between the body and the drain 232.

The operation of disconnect switch circuit illustrated in FIG. 2A will be described now. During startup, when MOSFET $T_D$ is in off-state, intrinsic diode 237 is forward biased and pulls Vcc up one diode drop (0.5 volt typically) below $V_{bat}$. Once Vcc passes the under-voltage level $V_R$ set by under-voltage reference 205, comparator 206 outputs a high level voltage to the input of inverter 207 to turn off MOSFET $T_s$. The output of comparator 206 is also provided to the enable terminal 220 of the oscillator 209 to enable oscillator/charge pump 208. Enabling oscillator/charge pump 208 then produces a voltage 5 to 10 volts above $V_{bat}$ to turn MOSFET $T_D$ on. The intrinsic diode 237 is shunted when MOSFET $T_D$ conducts.

In a fault condition where Vcc drops below the under voltage level $V_R$, comparator 206 outputs a low level voltage to disable the oscillator 209 and to turn on grounded shunt transistor $T_s$, resulting in a rapid discharge of gate 213 of the disconnect MOSFET $T_D$. As long as the shunt transistor $T_s$ remains on until Vcc drops to a low level (1.4 volt, for example), the disconnect MOSFET $T_D$ remains off and the head retract action can be completed.

When MOSFET $T_D$ is turned on, it exhibits a voltage drop of only 0.2 volts or less, as compared with the 0.5 volt drop which is typical of a Schottky diode.

Figure 3:
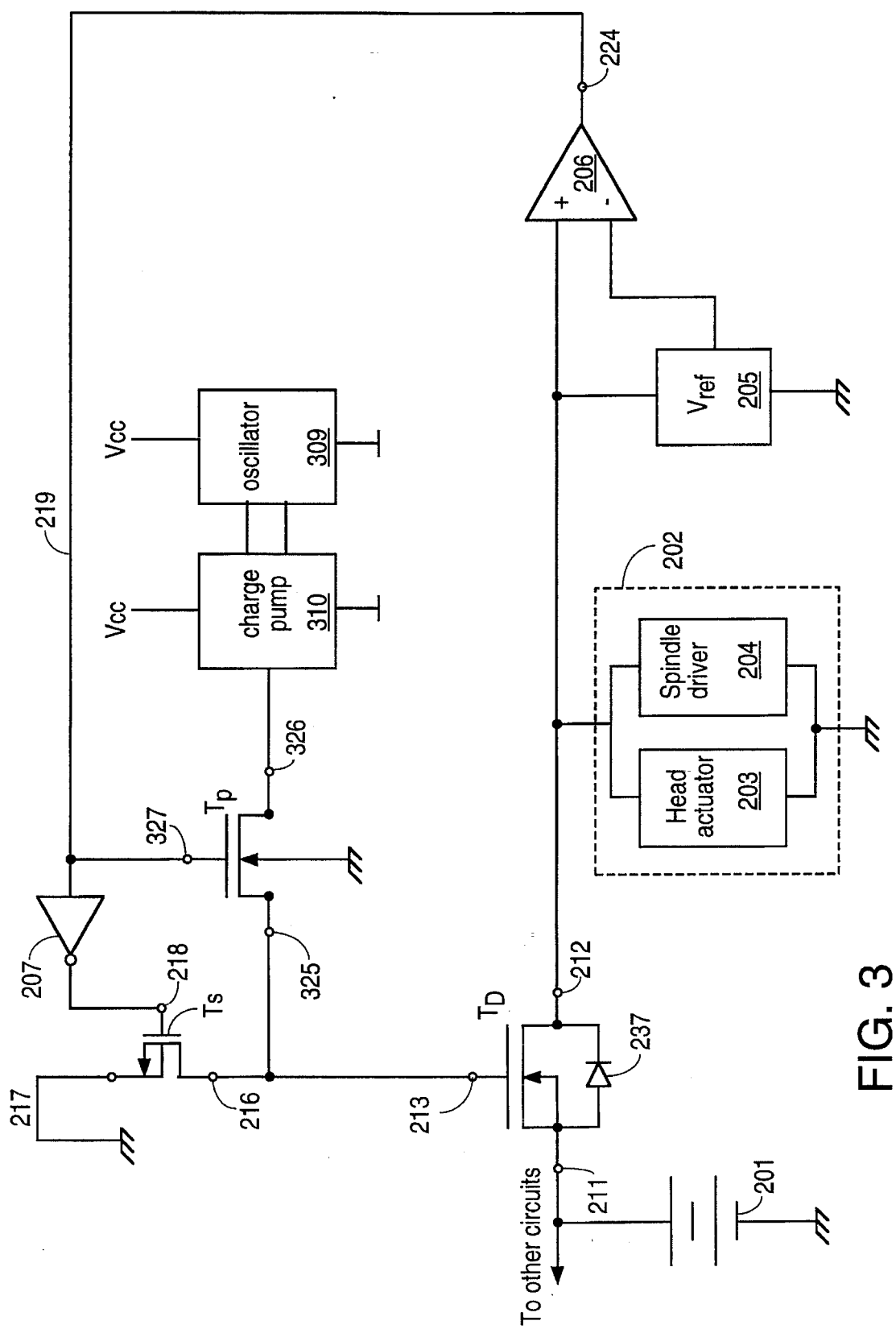
FIG. 3 shows a schematic diagram of a circuit in accordance with the second embodiment of the present invention.

FIG. 3 shows a modification of the disconnect switch circuit shown in FIG. 2A. Instead of the oscillator used in FIG. 2A, a battery-powered oscillator 309 is included, and the output of a charge pump 310 is provided to gate 213 of the disconnect MOSFET $T_D$ through a pass transistor $T_p$, which may also be a MOSFET. A gate 327 of pass transistor $T_p$ is connected to the output terminal 224 of comparator 206. Therefore, pass transistor $T_p$ conducts only when the output of comparator 206 is at a high level. The other parts of the circuit are similar to those in FIG. 2A.

During normal operation, Vcc is above the under-voltage level $V_R$ set by under-voltage reference 205, causing comparator 206 to output a high level voltage. The high level output of comparator 206 turns off grounded shunt transistor $T_s$ through inverter 207 and causes pass transistor $T_p$ to conduct, thereby providing the output of charge pump 310 to gate 213 of the disconnect MOSFET $T_D$. This turns MOSFET $T_D$ on. Since the charge pump is running prior to turn-on of $T_p$, transistor $T_D$ can be turned on rapidly. An under-voltage condition results in a low level output of comparator 206, which in turn turns on the grounded shunt transistor $T_s$ and turns off the pass transistor $T_p$ to quickly dump the charge on gate 313 of the disconnect MOSFET $T_D$. This turns MOSFET $T_D$ off.

Figure 4:
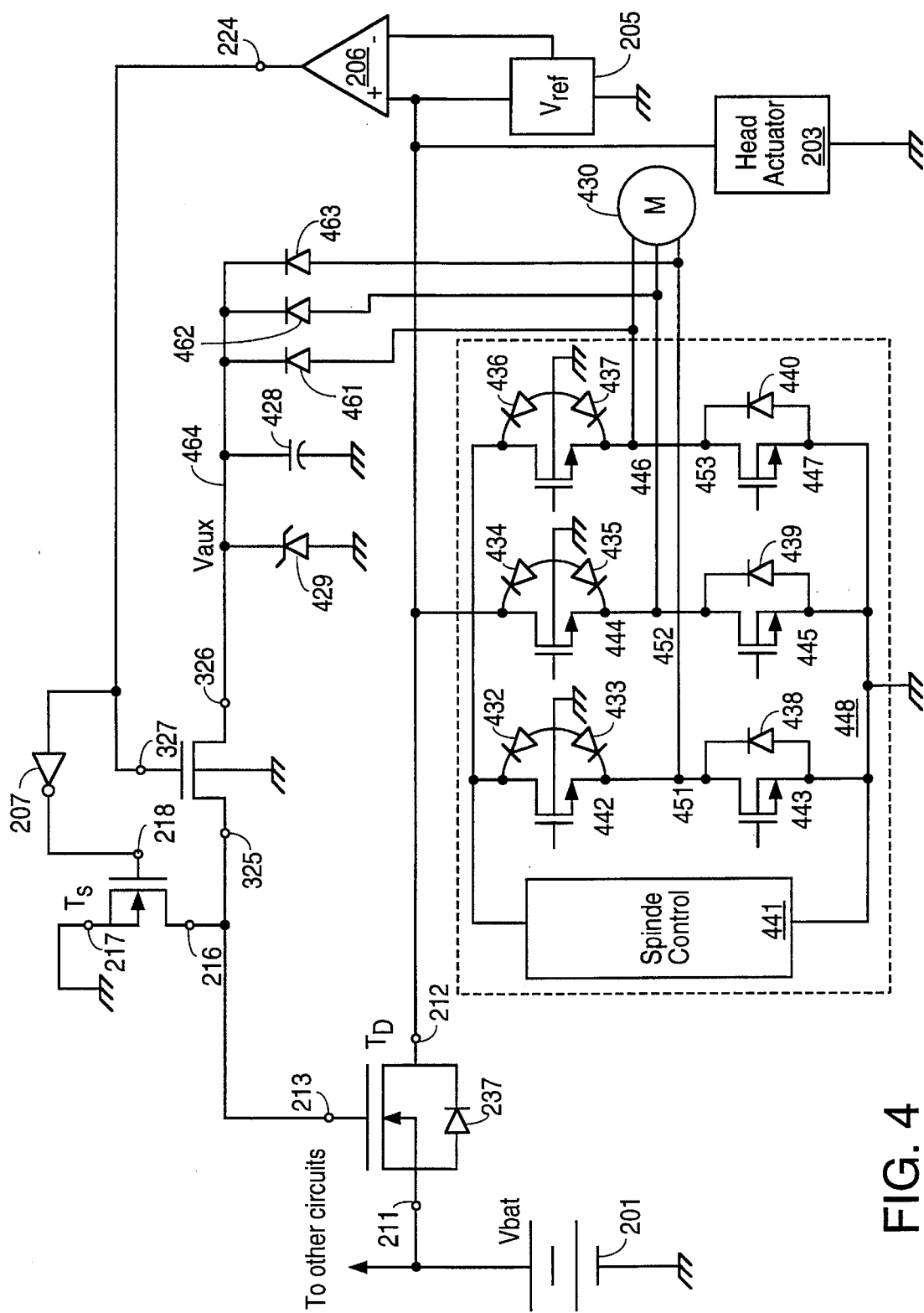
FIGS. 4 and 4A show schematic diagrams of circuits in accordance with the third embodiment of the present invention.

Reference is now made to FIG. 4, which shows the third embodiment of the present invention. This circuit is similar to the one shown in FIG. 3, except that the voltage needed to power gate 213 of the disconnect MOSFET $T_D$ is produced by an auxiliary supply voltage Vaux created by rectifying the positive going flyback transients of the spindle driver's highside MOSFETs, instead of the output of an oscillator/charge pump. As shown in FIG. 4, spindle driver 404 includes a three-phase output stage 448 to drive a three-phase motor 430. Output stage 448 includes three bridges 451, 452, and 453 each including two N-channel MOSFETs connected head-to-toe. A detailed description of this circuit can be found in above-referenced copending patent application Ser. No. 08/062,503, entitled "Push-Pull Output Stage for Driving Motors Which Generates Auxiliary Voltage Supply".

Figure 4A:
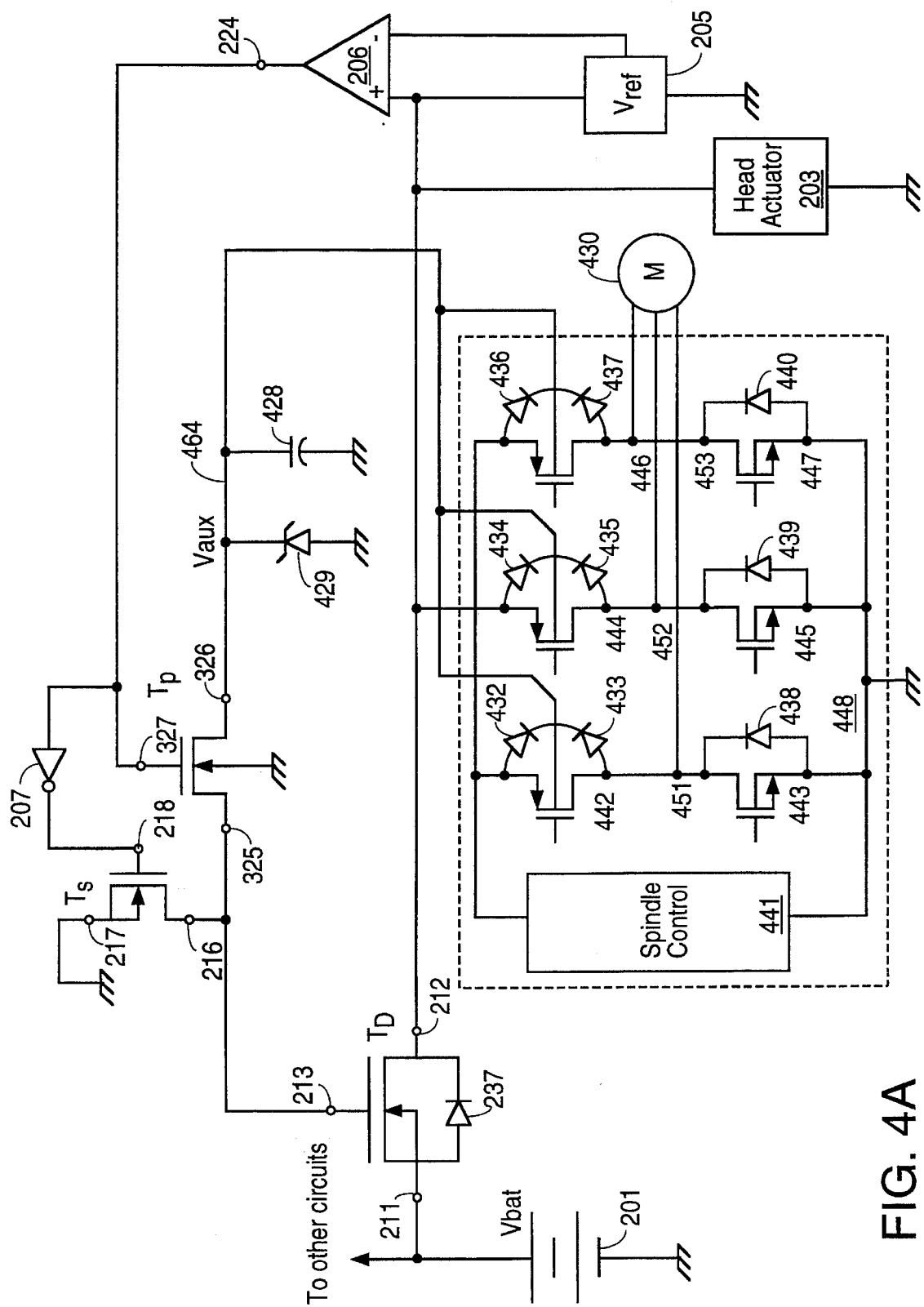

In order to develop Vaux, the source-to-body short in the highside MOSFETs 442, 444, and 446 must be eliminated. If these devices are N-channel, as shown, their body regions are grounded. (If they are P-channel, their body regions are connected to the auxiliary supply voltage Vaux as shown in FIG. 4A.) The output of each phase is then connected to the anode of one of rectifier diodes 461, 462, and 463, whose cathodes are tied to a line 464. A reservoir capacitor 428 and a Zener diode 429 are connected in parallel between line 464 and ground. A spindle control 441 generates control signals to the gates of MOSFETs 442–447 in the three-phase output stage 448 to produce a three-phase power supply for motor 430. The remaining components of this circuit are similar to the corresponding elements of FIGS. 2A and 3.

Once the spindle motor 430 is spinning, the positive going flyback pulses will charge reservoir capacitor 428 to create the auxiliary supply voltage Vaux which is limited to the breakdown voltage of Zener diode 429. The Vaux supply is connected to gate 213 of the disconnect MOSFET $T_D$ through pass transistor $T_p$, which conducts when the output of comparator 206 goes high. Like the circuit shown in FIG. 3, gate 213 of the disconnect MOSFET $T_D$ is shunted to ground by a grounded shunt transistor $T_s$ when the output of comparator 206 goes low.

Figure 5:
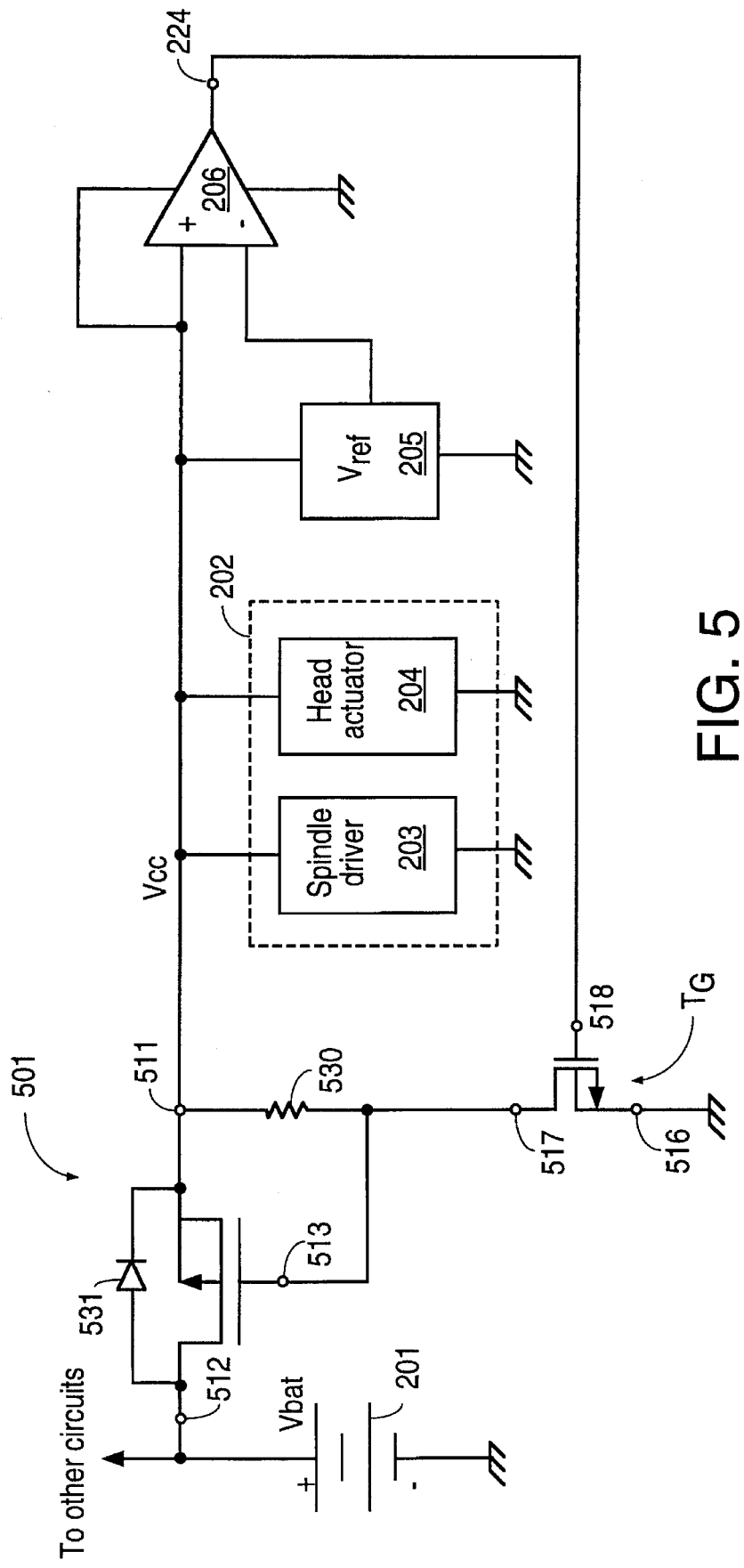
FIG. 5 shows a schematic diagram of a circuit wherein a P-channel device is used as a disconnect switch in accordance with the fourth embodiment of the present invention.

FIG. 5 shows a disconnect switch circuit diagram in accordance with the fourth embodiment, wherein a P-channel MOSFET 501 replaces the Schottky diode. In this case an oscillator/charge pump or auxiliary supply voltage Vaux is not required. A resistive short between a source/body terminal 511 and a gate terminal 513 of MOSFET 501 is formed by a resistor 530 to keep the disconnect MOSFET 501 in an off-state when Vcc drops below the $V_R$ output of under-voltage reference generator 205. During start-up, when the intrinsic diode 531 of the disconnect MOSFET 501 conducts, Vcc rises above the predetermined level set by under voltage reference 205. The output of comparator 206 goes high, and turns on a gate driver MOSFET $T_G$ which pulls gate 513 of the disconnect MOSFET 501 low, resulting in a negative gate to source voltage and turning MOSFET 501 on.

Figure 6:
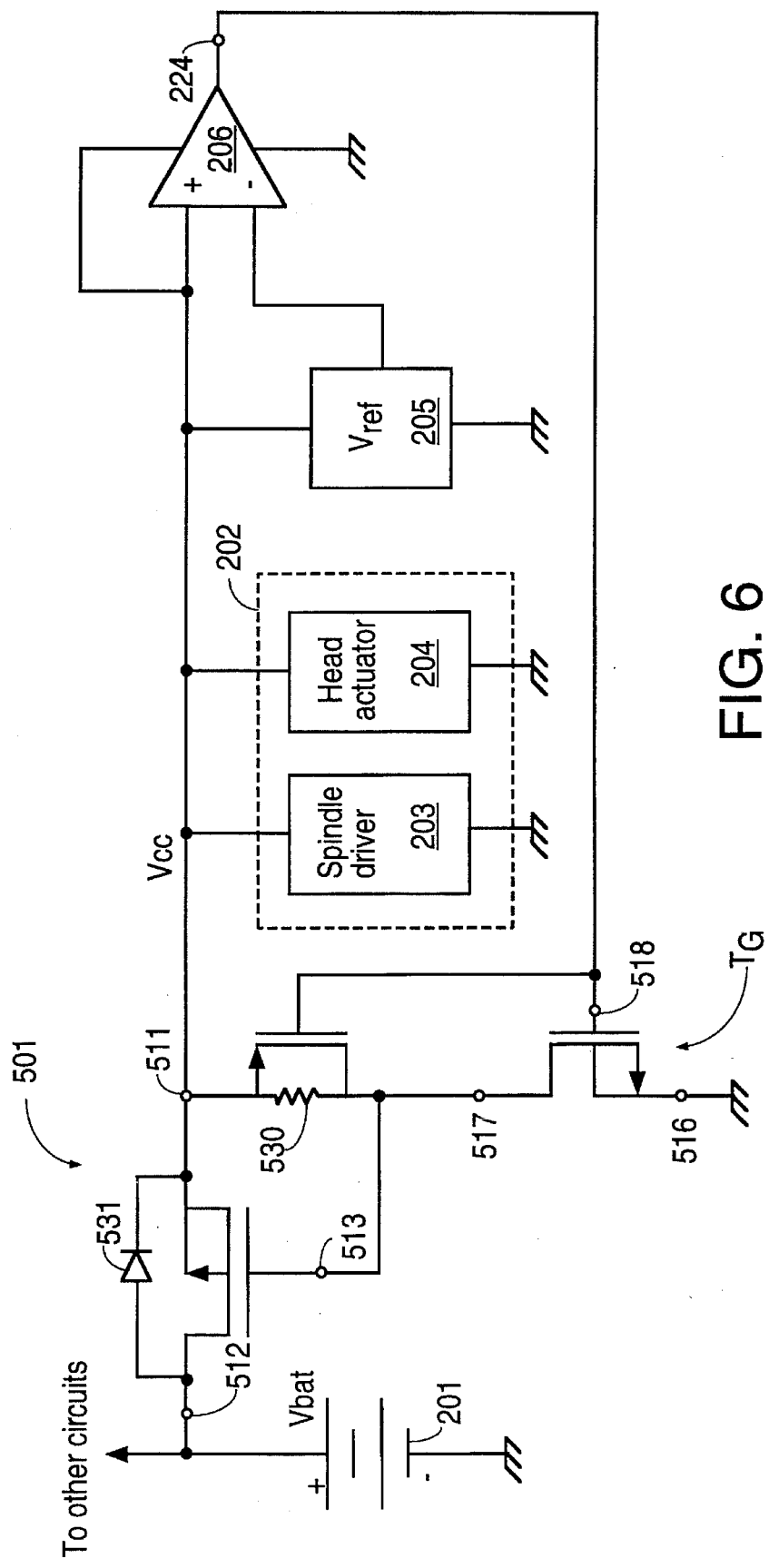
FIG. 6 shows a diagram of another circuit in accordance with the fourth embodiment of the present invention.

A PMOS device may be used to replace or parallel resistor 530 (as shown in FIG. 6) to speed up turn-off in a fault battery condition.

Although the present invention has been described in considerable detail with reference to certain preferred embodiments thereof, it will be apparent to those skilled in the art that various modification and improvements may be made without departing from the scope and the spirit of the invention. For example, the grounded shunt transistor $T_s$ in FIGS. 2, 3 and 4 may be replaced by a resistor; transistors of junction type may be used as the grounded shunt transistor $T_s$ instead of MOSFETs. Accordingly, it is to be understood that the invention is not to be limited by the specific illustrative embodiment, but only by the scope of the claims below.

What is claimed is:

1. A disconnect switch circuit for disconnecting a power source from a voltage supply line, the disconnect switch circuit comprising:
   a MOSFET switch;
   a first transistor connected to a gate of the MOSFET switch; and
   a comparator responsive to the supply voltage on the voltage supply line, said comparator providing a first output signal which causes the gate of the MOSFET switch to become charged so as to turn on the MOSFET switch when the supply voltage is above a predetermined reference voltage, said comparator providing a second output signal which causes the first transistor to discharge the gate of, and thus turn off, the MOSFET switch when the supply voltage drops below the predetermined reference voltage.

2. A disconnect switch circuit as in claim 1, wherein said MOSFET switch comprises an N-channel MOSFET device having a source and a body connected together and to the power source and having a drain connected to the voltage supply line.

3. A disconnect switch circuit as in claim 2, further comprising a charge pump to charge the gate of the MOSFET switch in response to said first output signal.

4. A disconnect switch circuit as in claim 2, further comprising a voltage reference circuit for generating the predetermined reference voltage.

5. A disconnect switch circuit as in claim 2, wherein the gate of the MOSFET switch is connected to an auxiliary supply through a second transistor, the auxiliary supply recovering energy from an inductive load and generating a voltage higher than the voltage of the power source, said second transistor conducting only when said supply voltage is above said predetermined reference voltage.

6. A disconnect switch circuit as in claim 5, wherein the inductive load is a spindle motor in a hard disk drive.

7. A disconnect switch circuit as in claim 6, wherein the spindle motor is driven by a multiphase output stage comprising multiple phase-bridges, each of the phase-bridges consisting of first and second MOSFETs connected in series between the voltage supply line and ground, the first MOSFET of each of the phase-bridges having a body and a source which are not connected together, the output terminals of the multi-phase output stage being connected by separate rectifying diodes to provide the auxiliary supply.

8. A disconnect switch circuit as in claim 7, wherein the first and second MOSFETs comprise N-channel devices, the body of each of the first MOSFETs being connected to ground.

9. A disconnect switch circuit as in claim 7, wherein the first and second MOSFETs comprise P-channel devices, the body of each of the first MOSFETs being connected to the auxiliary supply.

10. A disconnect switch circuit as in claim 1, wherein the MOSFET switch comprises a P-channel device having a drain connected to the power source and having a source and a body connected together and to the voltage supply line.

11. A disconnect switch circuit as in claim 10, wherein a P-channel MOS transistor is connected between the gate and the source/body terminal of the P-channel MOSFET switch, said P-channel MOS transistor conducting when said supply voltage drops below said predetermined reference limit.

12. A method for disconnecting a power source from a voltage supply line of a hard disk drive, said method comprising the steps of:
   providing a MOSFET between said power source and said voltage supply line;
   charging a gate of said MOSFET, using the flyback voltage of a spindle motor of said hard disk drive, when the voltage on said voltage supply line exceeds a predetermined reference voltage so as to turn on said MOSFET; and
   discharging said gate of said MOSFET so as to turn off said MOSFET when the voltage on said voltage supply line drops below said predetermined reference voltage.

13. A method for disconnecting a power source from a voltage supply line of a hard disk drive, said method comprising the steps of:
   providing a MOSFET between said power source and said voltage supply line;
   charging a gate of said MOSFET, using an oscillator/charge pump, when the voltage on said voltage supply line exceeds a predetermined reference voltage so as to turn on said MOSFET; and discharging said gate of said MOSFET so as to turn off said MOSFET when the voltage on said voltage supply line drops below said predetermined reference voltage.

14. A method as in claim 12 or 13, wherein said MOSFET comprises a P-channel device.

15. A combination comprising:

a power source;

a load capable of storing power;

a MOSFET having a source terminal connected to a positive terminal of said power source and a drain terminal connected to said load, said source terminal being shorted to a body of said MOSFET so as to create a diode having an anode connected to said source terminal and a cathode connected to said drain terminal, said MOSFET being turned on so as to allow a current to flow from said power source to said load through a channel of said MOSFET when said power source is functioning normally, and said MOSFET being turned off so as to block current flow from said load to said power source as a result of the storage of power in said load when said power source fails.

16. The combination of claim 15 wherein said power source comprises a battery.

17. The combination of claim 15 wherein said MOSFET comprises an N-channel MOSFET.

18. The combination of claim 15 wherein said load comprises a motor.

19. The combination of claim 18 wherein said load further comprises a spindle driver, said spindle driver comprising a high-side MOSFET and a low-side MOSFET, said high-side MOSFET including a body which is not shorted to either a source or a drain of said high-side MOSFET, a common node between said high-side and low-side MOSFETs being connected to said motor.

20. The combination of claim 19 wherein a current path extends between said common node and a gate of said MOSFET thereby allowing a voltage generated at said common node to charge said gate.

21. The combination of claim 15 further comprising a comparator having an input connected to a supply line connecting said MOSFET to said load, said comparator providing a first output signal which causes a gate of said MOSFET to become charged when a voltage on said supply line is above a reference voltage.

22. The combination of claim 21 wherein said comparator provides a second output signal which causes said gate to become discharged when said voltage on said supply line is below said reference voltage.

23. A method as in claims 12 or 13, wherein the step of charging said gate further comprises providing a transistor connected between said gate and ground, said transistor conducting only when said supply voltage drops below said predetermined reference voltage.

* * * * *

UNITED STATES PATENT AND TRADEMARK OFFICE
CERTIFICATE OF CORRECTION

PATENT NO.    :   5,508,874
DATED         :   April 16, 1996
INVENTOR(S)   :   Richard K. Williams, Allen A. Chang and Barry J. Concklin It is certified that error appears in the above-identified patent and that said Letters Patent is hereby corrected as shown below:

Col. 1, line 50, delete "Vba$_{bat}$" and insert --V$_{bat}$--.

Signed and Sealed this

Twenty-seventh Day of August, 1996

Attest:

BRUCE LEHMAN

Attesting Officer    Commissioner of Patents and Trademarks